(12) United States Patent
Hasegawa et al.

(10) Patent No.: US 9,041,456 B2
(45) Date of Patent: May 26, 2015

(54) POWER SEMICONDUCTOR DEVICE

(71) Applicant: MITSUBISHI ELECTRIC CORPORATION, Tokyo (JP)

(72) Inventors: Maki Hasegawa, Tokyo (JP); Masataka Shiramizu, Tokyo (JP); Shinji Sakai, Tokyo (JP); Takuya Shiraishi, Tokyo (JP)

(73) Assignee: MITSUBISHI ELECTRIC CORPORATION (JP)

( * ) Notice: Subject to any disclaimer, the term of this patent is extended or adjusted under 35 U.S.C. 154(b) by 0 days.

(21) Appl. No.: 14/043,586

(22) Filed: Oct. 1, 2013

(65) Prior Publication Data

US 2014/0184303 A1   Jul. 3, 2014

(30) Foreign Application Priority Data

Dec. 28, 2012 (JP) ................................ 2012-287634

(51) Int. Cl.
*H03K 17/687* (2006.01)
*H03K 17/567* (2006.01)
*H03K 17/12* (2006.01)
(Continued)

(52) U.S. Cl.
CPC .............. *H03K 17/567* (2013.01); *H03K 17/12* (2013.01); *H01L 23/49562* (2013.01); *H01L 23/49575* (2013.01); *H03K 2217/0036* (2013.01); *H01L 23/3107* (2013.01); *H01L 24/32* (2013.01); *H01L 24/45* (2013.01); *H01L 24/48* (2013.01); *H01L 24/49* (2013.01); *H01L 24/73* (2013.01); *H01L 2224/04042* (2013.01); *H01L 2224/32245* (2013.01); *H01L 2224/45124* (2013.01); *H01L 2224/45144* (2013.01); *H01L 2224/45147* (2013.01); *H01L 2224/48137* (2013.01); *H01L 2224/48247* (2013.01); *H01L 2224/48464* (2013.01); *H01L 2224/49111* (2013.01); *H01L 2224/49175* (2013.01); *H01L 2224/73265* (2013.01); *H01L 2924/10253* (2013.01); *H01L 2924/10272* (2013.01); *H01L 2924/1033* (2013.01); *H01L 2924/1203* (2013.01);
(Continued)

(58) Field of Classification Search
USPC ......... 327/374–377, 108–112, 427, 434, 437; 326/82, 83; 257/401, E29.027
See application file for complete search history.

(56) References Cited

U.S. PATENT DOCUMENTS 5,774,000 A * 6/1998 Vercellotti et al. ............ 327/110
5,932,934 A * 8/1999 Hofstetter et al. .............. 307/26
(Continued)

FOREIGN PATENT DOCUMENTS

JP      61072411 A  *  4/1986
JP      04-354156 A    12/1992
(Continued)

OTHER PUBLICATIONS

U.S. Appl. No. 13/677,028; Nov. 14, 2012.
(Continued)

*Primary Examiner* — Lincoln Donovan
*Assistant Examiner* — Thomas Skibinski
(74) *Attorney, Agent, or Firm* — Studebaker & Brackett PC

(57) ABSTRACT

A transistor being one of an IGBT and a MOSFET and arranged near a gate control circuit applies a gate control signal from the gate control circuit to the gate of a transistor arranged far from the gate control circuit. A gate control signal is applied via a resistive element to the transistor arranged near the gate control circuit.

19 Claims, 14 Drawing Sheets

(51) Int. Cl.
*H01L 23/495* (2006.01)
*H01L 23/31* (2006.01)
*H01L 23/00* (2006.01)

(52) U.S. Cl.
CPC ............... *H01L2924/13055* (2013.01); *H01L 2924/13091* (2013.01)

(56) References Cited

U.S. PATENT DOCUMENTS

| | | | |
|---|---|---|---|
| 6,057,726 A * | 5/2000 | Sumida | 327/333 |
| 7,230,587 B2 * | 6/2007 | Onozawa et al. | 345/60 |
| 7,348,826 B1 * | 3/2008 | Klein et al. | 327/430 |
| 7,372,432 B2 * | 5/2008 | Lee | 345/60 |
| 7,741,883 B2 * | 6/2010 | Fuller et al. | 327/108 |
| 8,351,231 B2 * | 1/2013 | Tagome | 363/71 |
| 2011/0247848 A1 | 10/2011 | Sieber et al. | |
| 2012/0057387 A1 * | 3/2012 | Lai et al. | 363/132 |
| 2012/0235710 A1 * | 9/2012 | Roessler et al. | 327/109 |
| 2012/0280728 A1 * | 11/2012 | Hussein et al. | 327/155 |
| 2013/0062626 A1 * | 3/2013 | Takao et al. | 257/77 |
| 2013/0155745 A1 | 6/2013 | Tanaka et al. | |
| 2013/0257177 A1 * | 10/2013 | Jacobson et al. | 307/115 |

FOREIGN PATENT DOCUMENTS

| | | | |
|---|---|---|---|
| JP | 2000-138342 A | | 5/2000 |
| JP | 2002016486 A | * | 1/2002 |
| JP | 2005-129826 A | | 5/2005 |
| JP | 2009-016757 A | | 1/2009 |
| JP | 2013-125806 A | | 6/2013 |
| WO | 2010/072433 A1 | | 7/2010 |
| WO | WO 2011096232 A1 | * | 8/2011 |

OTHER PUBLICATIONS

An Office Action; "Notice of Reasons for Rejection," issued by the Japanese Patent Office on Mar. 17, 2015, which corresponds to Japanese Patent Application No. 2012-287634 and is related to U.S. Appl. No. 14/043,586; with English language partial translation.

* cited by examiner (a) (b)

US 9,041,456 B2

POWER SEMICONDUCTOR DEVICE

BACKGROUND OF THE INVENTION

1. Field of the Invention

The present invention relates to a power semiconductor device, and more specifically, to a power semiconductor device that uses an IGBT and a MOSFET operated in parallel as switching devices.

2. Description of the Background Art

Regarding a switching device such as an IGBT (insulated gate bipolar transistor), introducing a structure of connecting the IGBT and a MOSFET (MOS field effect transistor) in parallel has conventionally been considered with the intention of reducing switching loss.

As an example, Japanese Patent Application Laid-Open No. 4-354156 (1992) discloses in FIG. 5 a structure where the respective gates of an IGBT and a MOSFET connected in parallel are connected in common to a gate driving circuit, and the IGBT and the MOSFET are driven by the common gate driving circuit.

This structure takes advantage of a difference in threshold voltage between the IGBT and the MOSFET to reflect the turn-off characteristics of the MOSFET in transient characteristics at the time of its turn-off and accommodate the turn-off characteristics of the IGBT that generates large turn-off loss, thereby reducing switching loss.

In the aforementioned structure of Japanese Patent Application Laid-Open No. 4-354156, an ON threshold voltage for the IGBT is set higher than that of the MOSFET, so that a total current always flows in the MOSFET in a transient state at the time of switching. In response, the current rating of the MOSFET should be increased. However, this in turn makes it difficult to reduce the chip size of the MOSFET, making the size reduction of the entire device difficult.

SUMMARY OF THE INVENTION

It is an object of the present invention to reduce the size of an entire power semiconductor device that uses an IGBT and a MOSFET operated in parallel as switching devices.

A power semiconductor device of the present invention includes: an inverter composed of a first switching part and a second switching part interposed in series between a first power source line through which a first voltage is applied and a second power source line through which a second voltage is applied, the first and second switching parts operating complementarily; and a first control circuit and a second control circuit that control switching operations of the first and second switching parts respectively. The first and second switching parts and the first and second control circuits are combined into a module. The first switching part includes a first IGBT and a first MOSFET. The first IGBT and the first MOSFET each have one main electrode connected to the first power source line and an opposite main electrode connected to an output node of the inverter. The second switching part includes a second IGBT and a second MOSFET. The second IGBT and the second MOSFET each have one main electrode connected to the second power source line and an opposite main electrode connected to the output node of the inverter. In a planar layout of the power semiconductor device, the first control circuit is arranged to face the first switching part, one of the first IGBT and the first MOSFET is arranged near the first control circuit, and the other of the first IGBT and the first MOSFET is arranged in a position farther from the first control circuit than the transistor near the first control circuit. The second control circuit is arranged to face the second switching part, one of the second IGBT and the second MOSFET is arranged near the second control circuit, and the other of the second IGBT and the second MOSFET is arranged in a position farther from the second control circuit than the transistor near the second control circuit. The transistor being one of the first IGBT and the first MOSFET and arranged near the first control circuit applies a gate control signal from the first control circuit to the gate of the transistor arranged far from the first control circuit. The transistor being one of the second IGBT and the second MOSFET and arranged near the second control circuit applies a gate control signal from the second control circuit to the gate of the transistor arranged far from the second control circuit. A gate control signal is applied from the first control circuit via a resistive element to the gate of a transistor being one of the first IGBT and the first MOSFET. A gate control signal is applied from the second control circuit via a resistive element to the gate of a transistor being one of the second IGBT and the second MOSFET.

In the aforementioned power semiconductor device, an IGBT and a MOSFET are not required to be arranged in parallel to a control circuit. Thus, the size of the entire device can be reduced while the IGBT and the MOSFET functioning as switching devices are used in parallel. Further, a gate control signal is applied from the first control circuit via a resistive element to the gate of a transistor being one of the first IGBT and the first MOSFET, and a gate control signal is applied from the second control circuit via a resistive element to the gate of a transistor being one of the second IGBT and the second MOSFET. This suppresses oscillation to occur when the IGBT and the MOSFET are driven in parallel.

These and other objects, features, aspects and advantages of the present invention will become more apparent from the following detailed description of the present invention when taken in conjunction with the accompanying drawings.

BRIEF DESCRIPTION OF THE DRAWINGS

FIG. 16 explains reduction of loss at the time of turn-on;

FIG. 19 shows the current and voltage characteristics and the gate voltage characteristics of a MOSFET at the time of turn-on.

EMBODIMENT FOR CARRYING OUT THE INVENTION

<Preferred Embodiment>

Figure 1:
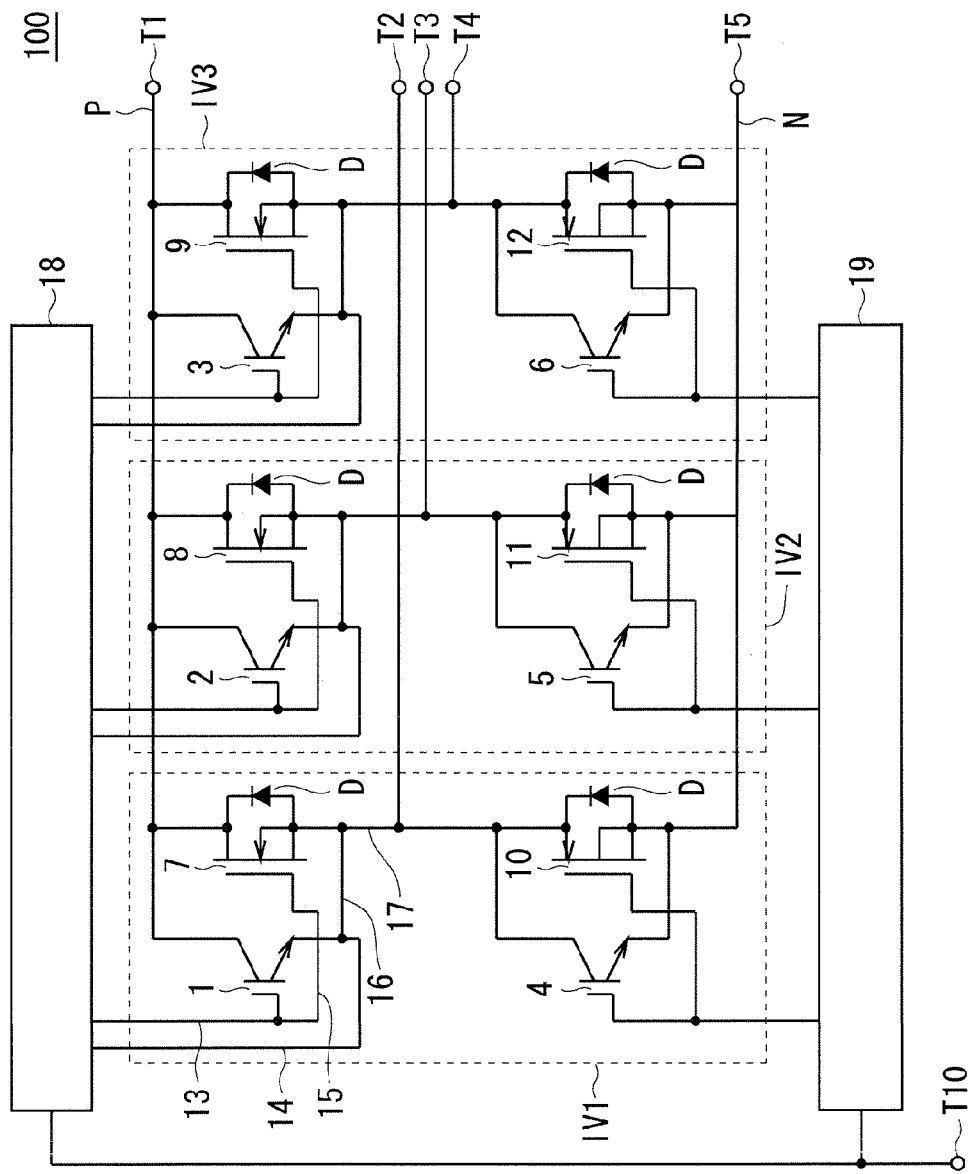
FIG. 1 shows the circuit structure of a three-phase inverter module according to a preferred embodiment of the present invention.

FIG. 1 shows the circuit structure of a three-phase inverter module 100 according to a preferred embodiment of a power semiconductor device of the present invention.

The three-phase inverter module 100 of FIG. 1 is composed of three inverters IV1 to IV3.

The inverter IV1 includes MOSFETs (MOS field effect transistors) 7 and 10 connected in series between a power source line P connected to a terminal T1 to receive a power source voltage and a power source line N connected to a terminal T5 to receive a reference voltage, and IGBTs (insulated gate bipolar transistors) 1 and 4 connected in parallel to the MOSFETs 7 and 10 respectively. The respective sources and the respective drains of the MOSFETs 7 and 10 are connected in common to a terminal T2. The IGBT 1 and the MOSFET 7 are high-potential side switching devices which form a high-potential side switching part. The IGBT 4 and the MOSFET 10 are low-potential side switching devices which form a low-potential side switching part.

The term "MOS" mentioned herein has formerly been used to designate a stacked structure of metal, oxide, and semiconductor, and has been considered to get its name from the initials of metal, oxide, and semiconductor. Meanwhile, referring particularly to a field effect transistor having a MOS structure (hereinafter simply called a "MOS transistor"), a material for a gate insulating film or a gate electrode has been improved in response to a higher integration level and improvement of manufacturing processes in recent years, for example.

Referring for example to a MOS transistor, polycrystalline silicon has been used instead of metal as a material for a gate electrode in terms of mainly forming a soured and a drain in a self-aligned manner. Further, a material of a high dielectric constant is used as a material for a gate insulating film in terms of improving electrical characteristics. Such a high-dielectric constant material is not necessarily limited to an oxide.

Hence, use of the term "MOS" is not limited to a stacked structure of metal, oxide, and semiconductor, and the present specification does not assume this limitation as a precondition. To be specific, the term "MOS" mentioned herein is not only the abbreviation resulting from its origin but it also widely encompasses a stacked structure of conductor, insulator, and semiconductor.

Like the inverter IV1, the inverter IV2 includes MOSFETs 8 and 11 connected in series between the power source lines P and N, and IGBTs 2 and 5 connected in parallel to the MOSFETs 8 and 11 respectively. The respective sources and the respective drains of the MOSFETs 8 and 11 are connected in common to a terminal T3. The IGBT 2 and the MOSFET 8 are high-potential side switching devices which form a high-potential side switching part. The IGBT 5 and the MOSFET 11 are low-potential side switching devices which form a low-potential side switching part.

The inverter IV3 includes MOSFETs 9 and 12 connected in series between the power source lines P and N, and IGBTs 3 and 6 connected in parallel to the MOSFETs 9 and 12 respectively. The respective sources and the respective drains of the MOSFETs 9 and 12 are connected in common to a terminal T4. The IGBT 3 and the MOSFET 9 are high-potential side switching devices which form a high-potential side switching part. The IGBT 6 and the MOSFET 12 are low-potential side switching devices which form a low-potential side switching part. A diode D is connected in antiparallel to each of the MOSFETs 7 to 9 and 10 to 12, and these diodes D are internal parasitic diodes.

The respective gates of the MOSFET 7 and the IGBT 1 are connected in common to a gate control circuit 18. The source of the MOSFET 7 and the emitter of the IGBT 1 are connected in common to the gate control circuit 18.

The respective gates of the MOSFET 8 and the IGBT 2 are connected in common to the gate control circuit 18. The source of the MOSFET 8 and the emitter of the IGBT 2 are connected in common to the gate control circuit 18.

The respective gates of the MOSFET 9 and the IGBT 3 are connected in common to the gate control circuit 18. The source of the MOSFET 9 and the emitter of the IGBT 3 are connected in common to the gate control circuit 18.

A connecting line connecting each of the gates of the IGBTs 1 to 3 and the gate control circuit 18 is called a line 13. A connecting line connecting each of the gates of the IGBTs 1 to 3 and the gate of a corresponding one of the MOSFETs 7 to 9 is called a line 15. A connecting line connecting each of the emitters of the IGBTs 1 to 3 and the source of a corresponding one of the MOSFETs 7 to 9 is called a line 16. A connecting line connecting each of the lines 16 and the gate control circuit 18 is called a line 14. A connecting line connecting each of the lines 16 and a corresponding one of the terminals T2 to T4 is called a line 17.

The respective gates of the MOSFET 10 and the IGBT 4 are connected in common to a gate control circuit 19. The respective gates of the MOSFET 11 and the IGBT 5 are connected in common to the gate control circuit 19. The respective gates of the MOSFET 12 and the IGBT 6 are connected in common to the gate control circuit 19.

The reference voltage is applied via a terminal T 10 to the gate control circuits 18 and 19.

Figure 2:
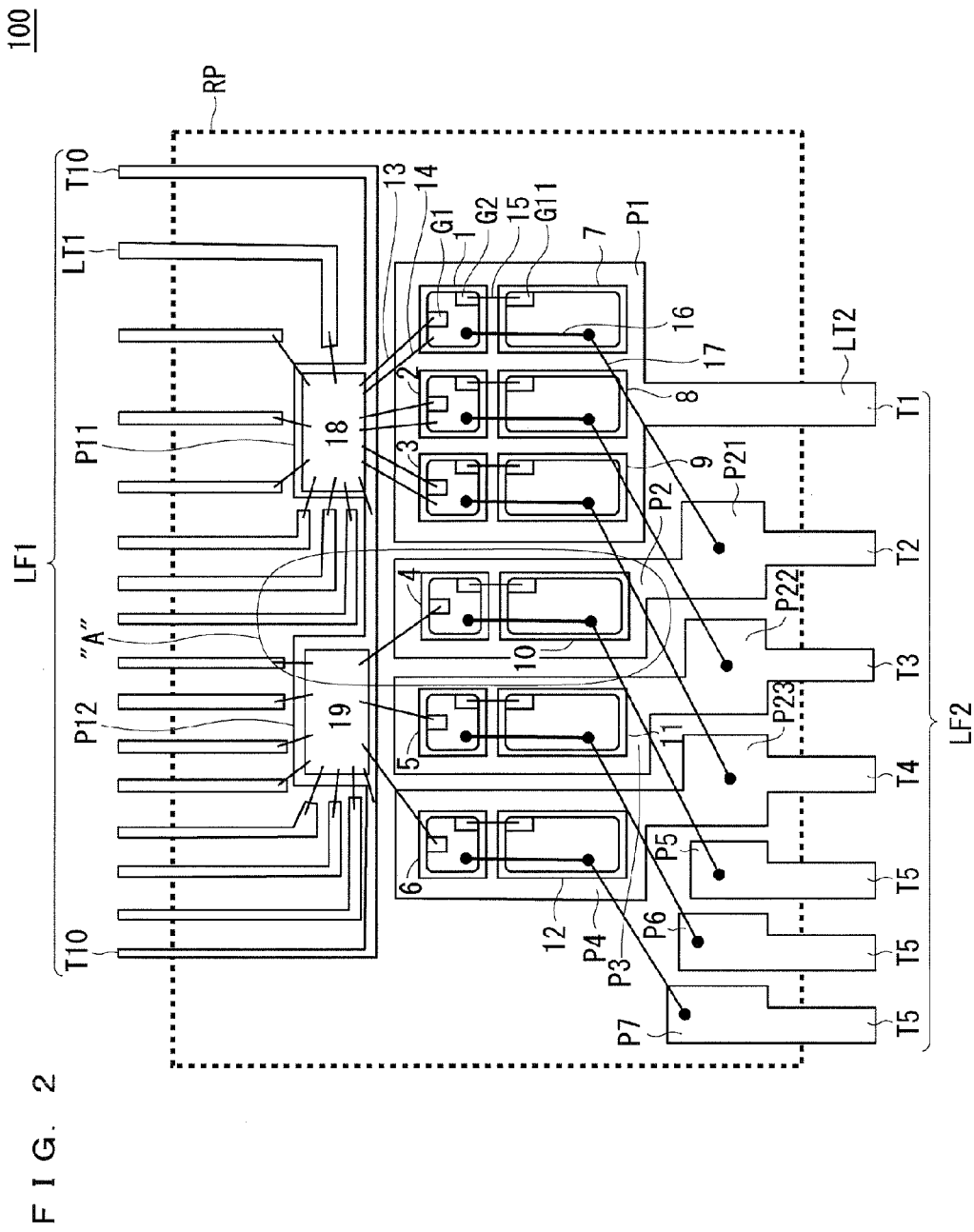
FIG. 2 shows the internal structure of the three-phase inverter module according to the preferred embodiment of the present invention.

FIG. 2 shows the internal structure of the three-phase inverter module 100. The three-phase inverter module 100 is packaged by being sealed with resin. In FIG. 2, the sealing resin is not shown and a forming region of a resin package RP is indicated by dotted lines.

As shown in FIG. 2, in the three-phase inverter module 100, the gate control circuits 18 and 19 are arranged along one of the long sides of the rectangular resin package RP, whereas the IGBTs 1 to 6 and the MOSFETs 7 to 12 are arranged along the opposite long side thereof.

As shown in FIG. 2, the three-phase inverter module 100 includes the gate control circuits 18 and 19 for switching devices, and is called an IPM (intelligent power module) accordingly.

A lead frame LF1 is arranged on the same side as the gate control circuits 18 and 19. A lead frame LF2 is arranged on the same side as the IGBTs 1 to 6 and the MOSFETs 7 to 12.

The lead frame LF1 includes a plurality of leads LT1, and die pads P11 and P12 on which the gate control circuits 18 and 19 are mounted respectively.

The die pads P11 and P12 are arranged parallel to a long side of the resin package RP and are connected mutually. Each of the die pads P11 and P12 is connected to some of the leads LT1. The gate control circuits 18 and 19 receive the reference voltage via the leads LT1 connected to the die pads P11 and P12, so that these leads LT1 function as the terminal T10 of FIG. 1.

The lead frame LF2 includes seven leads LT2, die pads P1 to P4, and wire bonding regions P5 to P7 and P21 to P23.

The die pads P1 to P4 are arranged parallel to a long side of the resin package RP and are independent of each other. The die pads P2 to P4 are connected integrally to the wire bonding regions P21 to P23 respectively, and the wire bonding regions P21 to P23 are each connected integrally to a corresponding lead LT2. The die pad P1 and the wire bonding regions P5 to P7 are each connected integrally to a corresponding lead LT2. The wire bonding regions P21 to P23 and P5 to P7 are arranged parallel to a long side of the resin package RP.

The lead LT2 integral with the die pad P1 corresponds to the terminal T1 of FIG. 1, and the leads LT2 integral with the wire bonding regions P21 to P23 correspond to the terminals T2 to T4 respectively. The three leads LT2 integral with the wire bonding regions P5 to P7 correspond to the terminal T5.

In FIG. 2, the IGBTs 1 to 3 are arranged on an edge of the die pad P1 near the lead frame LF1 so as to face the gate control circuit 18, and the IGBTs 4 to 6 are arranged on edges of the die pads P2 to P4 respectively near the lead frame LF1 so as to face the gate control circuit 19.

The MOSFETs 7 to 9 are arranged on the die pad P1 so as to face the IGBTs 1 to 3 respectively. The MOSFETs 10 to 12 are arranged on the die pads P2 to P4 respectively so as to face the IGBTs 4 to 6 respectively.

Figure 3:
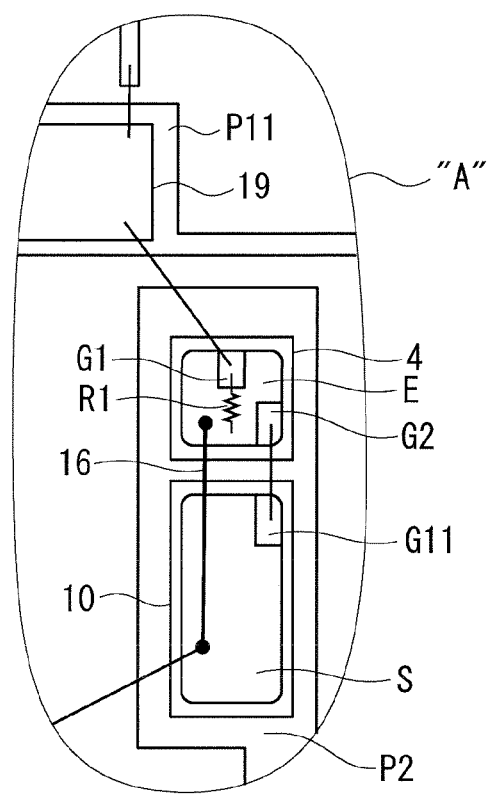
FIG. 3 is a partial view of the internal structure of the three-phase inverter module according to the preferred embodiment of the present invention.

FIG. 3 shows a region "A" of FIG. 1 in more detail. The region "A" is a region including the die pad P2, the IGBT 4 and the MOSFET 10 arranged on the die pad P2, and their surroundings. The structures of the IGBT and the MOSFET are described by referring to FIG. 3.

As shown in FIG. 3, the IGBT 4 has a collector contacting the main surface of the die pad P2, and an emitter E opposite the collector. The IGBT 4 is a vertical IGBT where a main current flows in a direction vertical to the main surface of a semiconductor substrate. The IGBT 4 has two gate pads G1 and G2 in a plane of the emitter E.

More specifically, the gate pad G1 is arranged on an edge portion of one of the short sides of the rectangular shape of the emitter E, and the gate pad G2 is arranged on an edge portion of the opposite short side thereof. The gate pads G1 and G2 communicate with each other inside the IGBT 4, so that a gate control signal applied to the gate pad G1 from the gate control circuit 19 can be taken out from the gate pad G2. The IGBT 4 is mounted on the die pad P2 such that the gate pad G1 faces the gate control circuit 19.

As shown in FIG. 3, the MOSFET 10 has a drain contacting the main surface of the die pad P2, and a source S opposite the drain. The MOSFET 10 is a vertical MOSFET where a main current flows in a direction vertical to the main surface of a semiconductor substrate. The MOSFET 10 has a gate pad G11 in a plane of the source S.

More specifically, the gate pad G11 is arranged on an edge portion of one of the short sides of the rectangular shape of the source S. The MOSFET 10 is mounted on the die pad P2 such that the gate pad G11 faces the IGBT 4. Regarding mounting of the IGBT 4 and the MOSFET 10 on the die pad P2, arranging the gate pad G2 of the IGBT 4 and the gate pad G11 of the MOSFET 10 so as to face each other acts advantageously in wire bonding. The IGBTs 1 to 3, 5 and 6, and the MOSFETs 7 to 9 and 11 and 12, have the same structures as those of the IGBT 4 and the MOSFET 10.

As shown in FIG. 2, the respective gate pads G1 (FIG. 3) and the respective emitters E (FIG. 3) of the IGBTs 1 to 3 are connected by wire bonding to the gate control circuit 18. The gate control circuit 18 and the gate pads G1 are connected via the lines 13, and the gate control circuit 18 and the emitters E are connected via the lines 14.

The respective gate pads G2 (FIG. 3) of the IGBTs 1 to 3 and the respective gate pads G11 (FIG. 3) of the MOSFETs 7 to 9 are connected by wire bonding respectively via the lines 15.

The respective emitters E (FIG. 3) of the IGBTs 1 to 3 and the respective sources S (FIG. 3) of the MOSFETs 7 to 9 are connected by wire bonding respectively via the lines 16.

Gold wires or copper wires are used as the lines 13 to 15, whereas aluminum wires are used as the lines 16.

The respective sources S (FIG. 3) of the MOSFETs 7 to 9 and the wire bonding regions P21 to P23 are connected by wire bonding respectively via the lines 17.

As shown in FIG. 2, the respective gate pads G1 (FIG. 3) of the IGBTs 4 to 6 are connected by wire bonding to the gate control circuit 19. The respective gate pads G2 (FIG. 3) of the IGBTs 4 to 6 and the respective gate pads G11 (FIG. 3) of the MOSFETs 10 to 12 are connected by wire bonding respectively.

The respective emitters E (FIG. 3) of the IGBTs 4 to 6 and the respective sources S (FIG. 3) of the MOSFETs 10 to 12 are connected by wire bonding respectively. The respective sources S (FIG. 3) of the MOSFETs 10 to 12 and the wire bonding regions P5 to P7 are connected by wire bonding respectively.

In the structure shown in FIG. 2, the gate pads G1 and G2 are provided in each of the IGBTs 1 to 6 arranged near the gate control circuits 18 and 19, the respective gate pads G1 of the IGBTs 1 to 6 and the gate control circuits 18 and 19 are connected by wire bonding, the respective gate pads G11 of the MOSFETs 7 to 12 arranged far from the gate control circuits 18 and 19 are connected by wire bonding to the respective gate pads G2 of the IGBTs 1 to 6 respectively. As a result, while the IGBTs and the MOSFETs functioning as switching devices are used in parallel, the size of the entire device can be reduced.

More specifically, two gate pads such as the gate pads G1 and G2 should be provided in each of the MOSFETs 7 to 12 if the MOSFETs 7 to 12 are arranged near the gate control circuits 18 and 19. This reduces the effective area of each of the MOSFETs 7 to 12 as a semiconductor chip.

For reduction of the ON resistance of a MOSFET, a chip size should be increased and this involves cost increase. Meanwhile, providing two gate pads in the MOSFET reduces the effective area thereof, so that the chip size should be increased more to maintain the effective area. However, increasing the chip size more involves size increase of the entire device.

In contrast, arranging the MOSFETs 7 to 12 far from the gate control circuits 18 and 19 requires only one gate pad in each of the MOSFETs 7 to 12. This avoids reduction of an effective area to make it unnecessary to increase a chip size. As a result, size increase of the entire device is avoided.

As shown in FIG. 3, a resistive element R1 is embedded under the gate pad G1 of the IGBT 4. A gate control signal from the gate control circuit 19 is applied to the IGBT 4 via the resistive element R1. This structure suppresses oscillation to occur when an IGBT and a MOSFET are driven in parallel, and allows size reduction of the module of the power semiconductor device.

Figure 4:
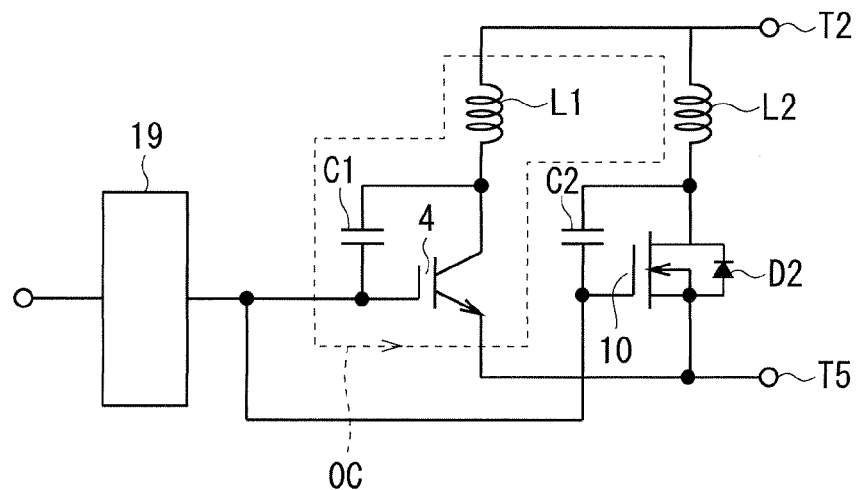
FIG. 4 explains oscillation to occur when an IGBT and a MOSFET are driven in parallel.

Oscillation to occur when an IGBT and a MOSFET are driven in parallel is described by referring to FIG. 4. FIG. 4 explains a mechanism of oscillation generated in a combination of the IGBT 4 and the MOSFET 10.

As shown in FIG. 4, an inductance component L1 and an inductance component L2 exist in a line between the collector of the IGBT 4 and the terminal T2 and a line between the drain of the MOSFET 10 and the terminal T2 respectively. A capacitive component C1 exists between the collector and the gate of the IGBT 4. A capacitive component C2 exists between the drain and the gate of the MOSFET 10. These capacitive components are capacitive components (parasitic capacitances) not avoidable in light of the device structure, and are called feedback capacitances.

A diode D2 is connected in antiparallel to the MOSFET 10, and the diode D2 is an internal parasitic diode. As a result of the presence of the aforementioned inductance components and the capacitive components, an oscillation circuit OC passing through the inductance components and the capacitive components is formed as indicated by dashed lines of FIG. 4, thereby generating LC oscillation. This is the oscillation to occur when an IGBT and a MOSFET are driven in parallel.

Figure 5:
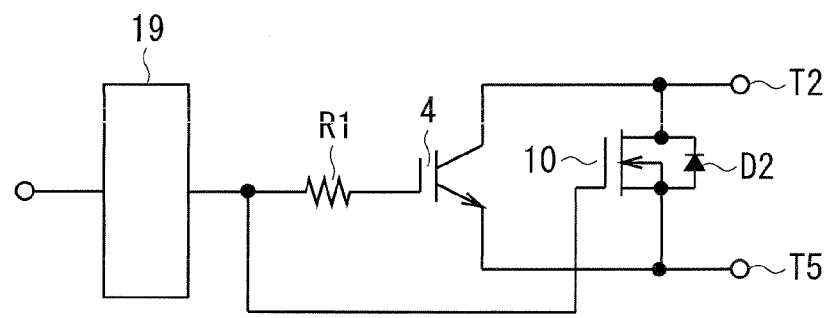
FIG. 5 shows a structure where a resistive element is connected to the gate of an IGBT.

In this case, the LC oscillation is suppressed by connecting the resistive element R1 to the gate of the IGBT 4 as shown in FIG. 5 and applying a gate control signal from the gate control circuit 19 to the gate via the resistive element R1.

Figure 6:
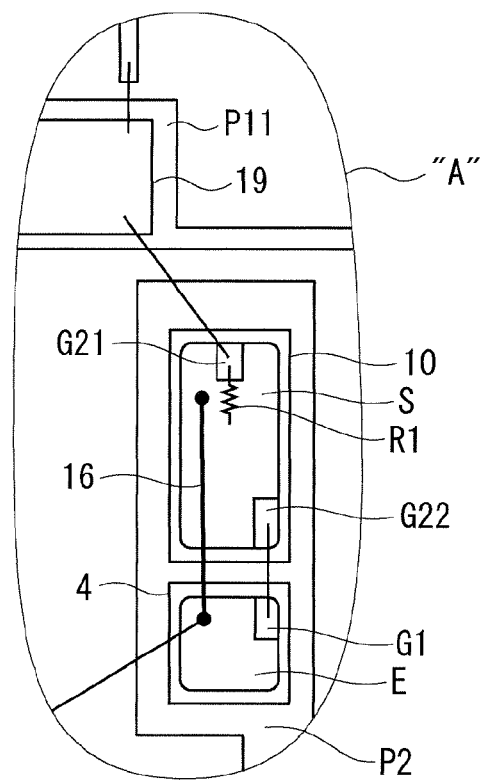
FIG. 6 is a partial view of the internal structure of the three-phase inverter module according to the preferred embodiment of the present invention.

FIG. 6 shows a structure where the positions of the IGBT 4 and the MOSFET 10 are changed with respect to each other on the die pad P2. The MOSFET 10 is arranged near the gate control circuit 19, whereas the IGBT 4 is arranged opposite the gate control circuit 19. Even if the positions of the IGBT 4 and the MOSFET 10 are changed with respect to each other, the aforementioned effect can still be achieved.

In the structure of FIG. 6, a gate pad G21 is arranged on an edge portion of one of the short sides of the rectangular shape of the source S of the MOSFET 10, and a gate pad G22 is arranged on an edge portion of the opposite short side thereof. The gate pads G21 and G22 communicate with each other inside the MOSFET 10, so that a gate control signal applied to the gate pad G21 from the gate control circuit 19 can be taken out from the gate pad G22. The MOSFET 10 is mounted on the die pad P2 such that the gate pad G21 faces the gate control circuit 19.

As shown in FIG. 6, a gate pad G1 is arranged on one edge portion of the rectangular shape of the emitter E of the IGBT 4. The IGBT 4 is mounted on the die pad P2 such that the gate pad G1 faces the MOSFET 10. Regarding mounting of the MOSFET 10 and the IGBT 4 on the die pad P2, arranging the gate pad G22 of the MOSFET 10 and the gate pad G1 of the IGBT 4 so as to face each other acts advantageously in wire bonding.

Figure 7:
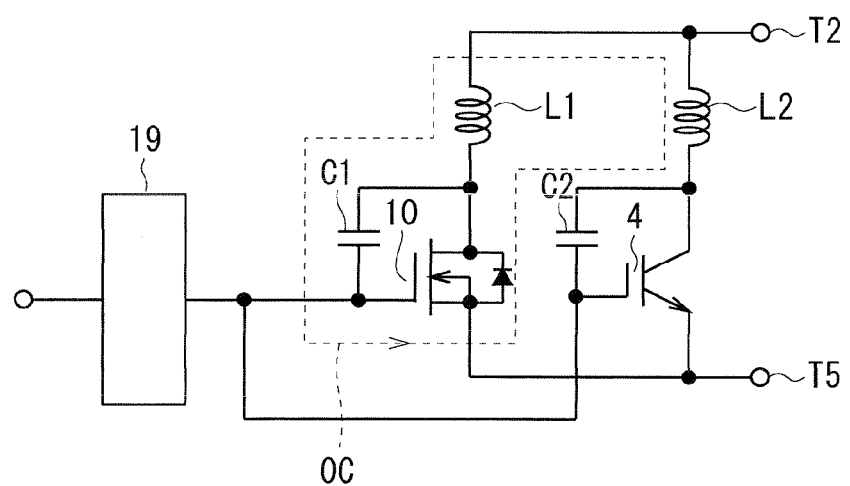
FIG. 7 explains oscillation to occur when an IGBT and a MOSFET are driven in parallel.

FIG. 7 explains a mechanism of oscillation generated in the arrangement of FIG. 6. As shown in FIG. 7, an inductance component L1 and an inductance component L2 exist in a line between the drain of the MOSFET 10 and the terminal T2 and a line between the collector of the IGBT 4 and the terminal T2 respectively. A capacitive component C1 exists between the drain and the gate of the MOSFET 10. A capacitive component C2 exists between the collector and the gate of the IGBT 4. As a result of the presence of these inductance components and the capacitive components, an oscillation circuit OC passing through the inductance components and the capacitive components is formed as indicated by dashed lines of FIG. 7, thereby generating LC oscillation.

Figure 8:
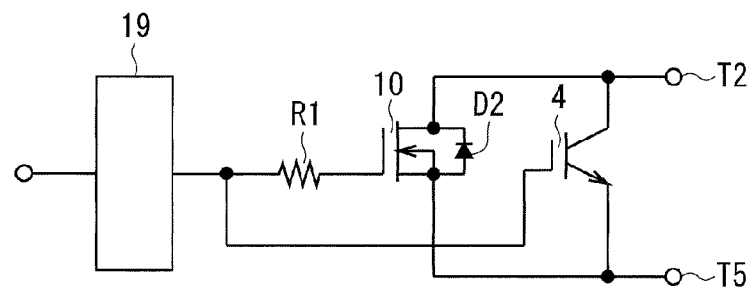
FIG. 8 shows a structure where a resistive element is connected to the gate of a MOSFET.

In this case, the LC oscillation is suppressed by connecting the resistive element R1 to the gate of the MOSFET 10 as shown in FIG. 8 and applying a gate control signal from the gate control circuit 19 to the gate via the resistive element R1.

If the resistive element R1 is connected to the gate of the MOSFET 10, the MOSFET 10 is turned on after the IGBT 4 is turned on at the time of turn-on. This suppresses a current to flow via a MOSFET at the time of switching, so that a rating for the maximum current to flow in the MOSFET becomes unnecessary. This allows size reduction of the MOSFET and eventually, size reduction of the entire module.

Figure 9:
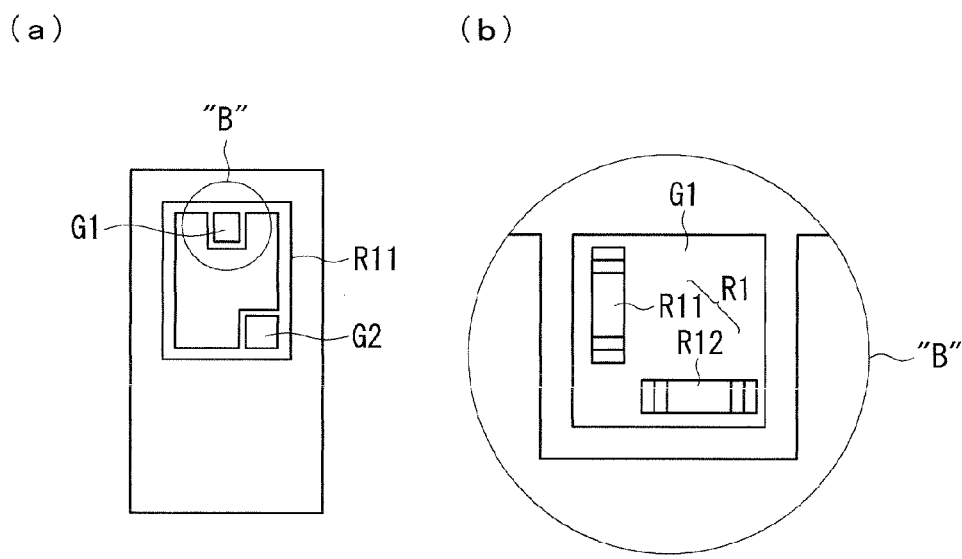
FIG. 9 shows an example of a structure where a resistive element is embedded under a gate pad of an IGBT.

FIG. 9 shows an example of a structure where the resistive element R1 is embedded under the gate pad G1 of the IGBT 4. Part (a) of FIG. 9 shows the planar structure of the IGBT 4, and part (b) of FIG. 9 shows a region "B" including the gate pad G1 in an enlarged manner.

Part (b) of FIG. 9 shows a structure where a resistive element R11 and a resistive element R12 are arranged along edge portions of the rectangular shape of the gate pad G1. The resistive elements R11 and R12 form the resistive element R1.

The resistive elements R11 and R12 are provided in space from under the gate pad G1 to a gate and cannot be seen from outside. However, for the sake of convenience, the resistive elements R11 and R12 are illustrated as those that can be seen from outside in part (b) of FIG. 9.

Connecting the resistive elements R11 and R12 in series can increase a resistance value. Connecting the resistive elements R11 and R11 in parallel can reduce a resistance value as compared to the case where the resistive element R11 or R12 is used alone, and can adjust the resistance value of the resistive element R1.

<First Modification>

In the structure described above, the IGBTs 1 to 6 or the MOSFETs 7 to 12 are arranged near the gate control circuits 18 and 19, and a resistive element is provided to the gate of a switching device arranged near the gate control circuit 18 or 19. Meanwhile, a resistive element may also be provided to the gate of a switching device arranged far from the gate control circuit 18 or 19.

Figure 10:
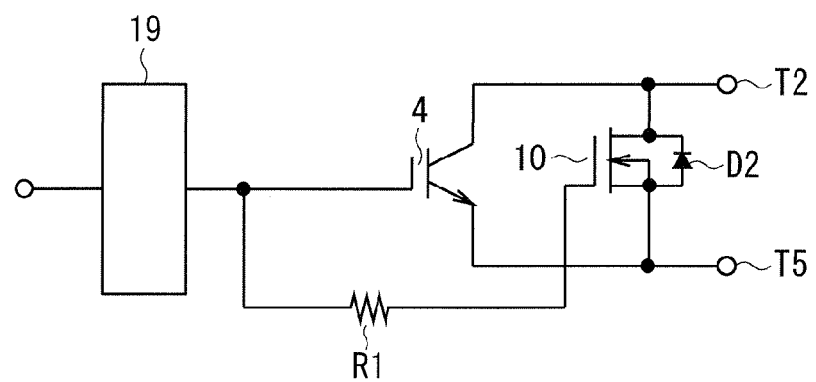
FIG. 10 shows a structure where a resistive element is connected to the gate of a MOSFET.

FIG. 10 shows a structure where the IGBT 4 is arranged near the gate control circuit 19, the MOSFET 10 is arranged far from the gate control circuit 19, and the resistive element R1 is connected to the gate of the MOSFET 10.

Even in this structure, the LC oscillation explained by referring to FIG. 4 is still suppressed by applying a gate control signal from the gate control circuit 19 to the gate via the resistive element R1.

Figure 11:
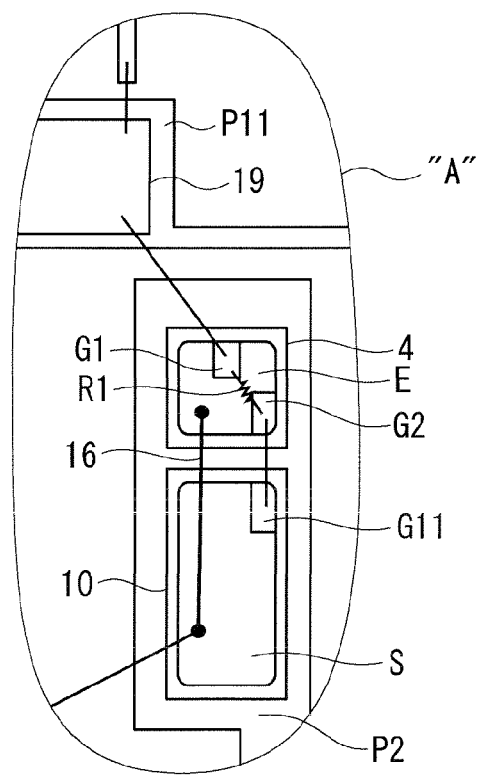
FIG. 11 is a partial view of the internal structure of the three-phase inverter module according to the preferred embodiment of the present invention.

FIG. 11 shows a structure corresponding to that of FIG. 3 where the MOSFET 10 is arranged far from the gate control circuit 19, and where the resistive element R1 is connected to the gate of the MOSFET 10. In the structure of FIG. 11, the resistive element R1 is embedded between the gate pads G1 and G2 of the IGBT 4.

In FIG. 11, the resistive element R1 is illustrated as being formed on the emitter E. However, the resistive element R1 cannot be formed on the emitter so part of the emitter region is cut and the resistive element R1 is formed on this part, resulting in reduction of the effective area of the IGBT 4. However, this in turn makes it unnecessary to embed the resistive element R1 in the MOSFET 10, so that the effective area of the MOSFET 10 is not reduced.

<Second Modification>

Figure 12:
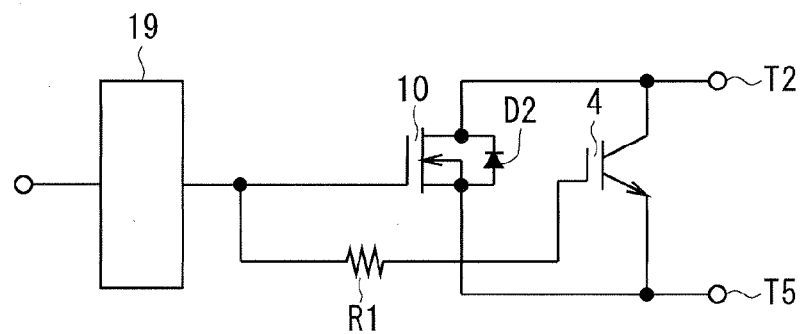
FIG. 12 shows a structure where a resistive element is connected to the gate of an IGBT.

The structure where a resistive element is connected to the gate of a switching device arranged far from the gate control circuit 18 or 19 may also be one shown in FIG. 12. As shown in FIG. 12, the MOSFET 10 is arranged near the gate control circuit 19, the IGBT 4 is arranged far from the gate control circuit 19, and the resistive element R1 is connected to the gate of the IGBT 4.

Figure 13:
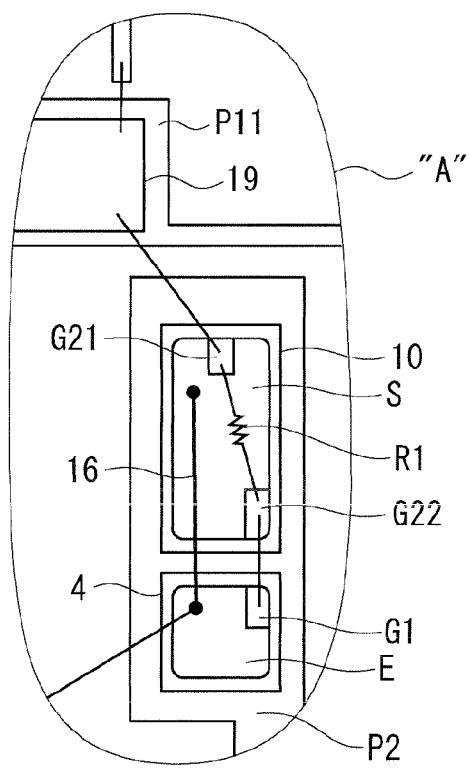
FIG. 13 is a partial view of the internal structure of the three-phase inverter module according to the preferred embodiment of the present invention.

FIG. 13 shows a structure corresponding to that of FIG. 6 where the IGBT 4 is arranged far from the gate control circuit 19, and where the resistive element R1 is connected to the gate of the IGBT 4. In the structure of FIG. 13, the resistive element R1 is embedded between the gate pads G21 and G22 of the MOSFET 10.

In FIG. 13, the resistive element R1 is illustrated as being formed on the source S. However, the resistive element R1 cannot be formed on the source so part of the source region is cut and the resistive element R1 is formed on this part, resulting in reduction of the effective area of the MOSFET 10. Meanwhile, regarding a MOSFET, the effective area of a chip should be increased to reduce the ON resistance thereof, so that the chip size of the MOSFET is generally larger than that of an IGBT.

Thus, influence of reduction of the effective area caused by formation of the gate pads G21, G22 and the resistive element R1 can be relatively small. Further, the resistive element R1 is not required to be embedded in the IGBT 4 and the IGBT 4 is not required to have two gate pads. As a result, a wider bonding region can be maintained in the IGBT 4 of a small chip size.

Arranging the MOSFETs 7 to 12 near the gate control circuits 18 and 19 achieves different effect as follows.

If the MOSFETs 7 to 12 are arranged far from the gate control circuits 18 and 19, a path through which a main circuit current flows overlaps a gate-charge loop. This may reduce the gate-to-emitter voltages of the IGBTs 1 to 6.

Figure 14:
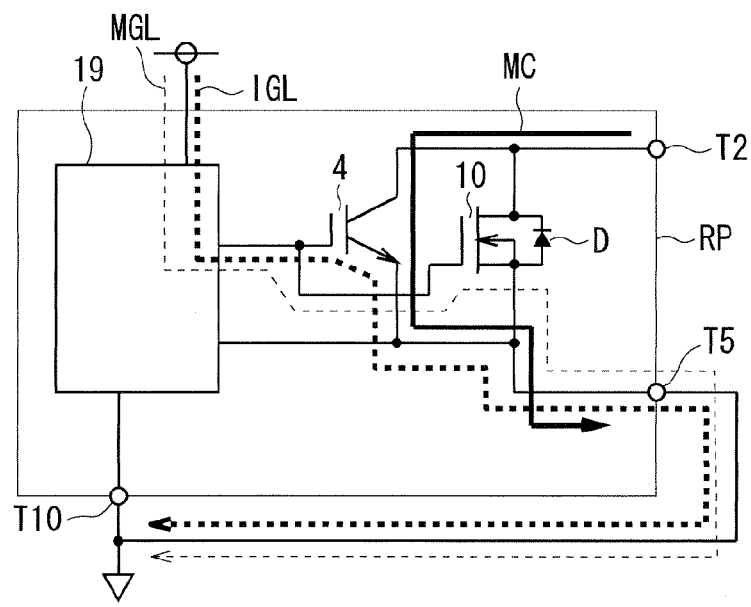
FIGS. 14 and 15 explain a mechanism of reduction of a gate-to-emitter voltage.

A mechanism of this reduction is explained by referring to FIG. 14. FIG. 14 shows a structure where a reference potential is taken from the reference potential of the gate control circuit 19 in the module.

For the sake of simplicity, only the combination of the MOSFET 10 and the IGBT 4 is shown in FIG. 14. FIG. 14 schematically shows a gate-charge loop IGL for the IGBT 4, a gate-charge loop MGL for the MOSFET 10, and a path MC of a main circuit current (most of which flows into the IGBT 4 at the time of application of an overload).

As shown in FIG. 14, part of the main circuit current path MC overlaps the gate-charge loop IGL for the IGBT 4 and the gate-charge loop MGL for the MOSFET 10. This may reduce the gate-to-emitter voltage of the IGBT 4 at the time of application of an overload.

Figure 15:
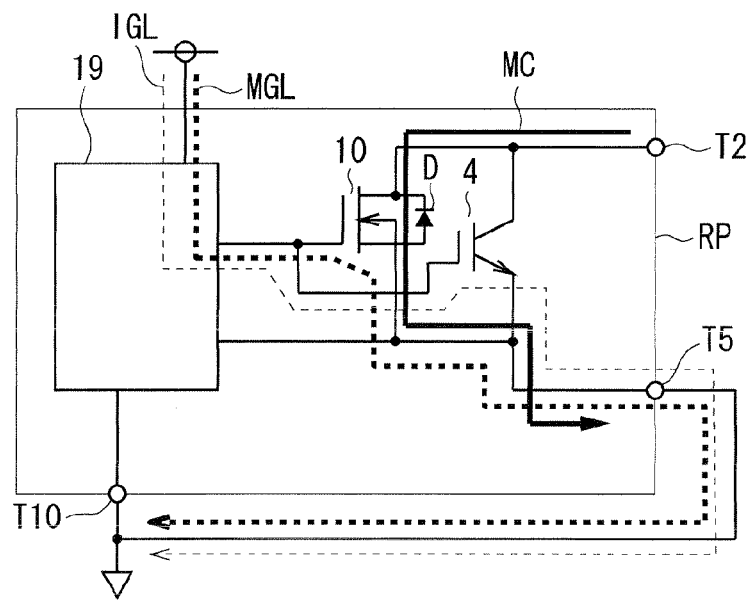

In contrast, if the MOSFET 10 is arranged near the gate control circuit 19 as shown in FIG. 15, overlap of the main circuit current path MC with the gate-charge loop IGL for the IGBT 4 is reduced. This suppresses reduction of the gate-to-emitter voltage of the IGBT 4.

To be specific, arranging the MOSFETs 7 to 12 near the gate control circuits 18 and 19 and arranging the IGBTs 1 to 6 far from the gate control circuits 18 and 19 suppresses reduction of a gate voltage.

As described above, arranging the MOSFETs 7 to 12 near the gate control circuits 18 and 19 suppresses reduction of the gate-to-emitter voltages of the IGBTs caused by the main circuit current to flow at the time of application of an overload, thereby allowing reduction of loss to be generated at the time of application of an overload.

<Third Modification>

In a structure where an IGBT and a MOSFET as switching devices are used in parallel, only the thresholds for the MOSFET and the IGBT are generally used for on-off control of both of the devices. In the present invention, on-off timing of each of the IGBT and the MOSFET is controlled by a resistive element embedded in a switching device and a balance between the thresholds for the IGBT and the MOSFET, such that the MOSFET is turned on first and the IGBT is turned on next.

In a structure where a resistive element is not connected to a gate, timing of switching is controlled only by the threshold for a device. Thus, if a threshold for a MOSFET is higher than that for an IGBT, the IGBT is turned on first and the MOSFET is turned off first. If a threshold for the MOSFET is lower than that for the IGBT, the MOSFET is turned on first and the IGBT is turned off first.

In the structure of the present invention, on-off timing of each of an IGBT and a MOSFET is controlled by a resistive element connected to a gate and by a balance between respective thresholds for the IGBT and the MOSFET. This structure allows the following cases: the IGBT is turned on and off first where a threshold for the MOSFET is higher than that for the IGBT; and the MOSFET is turned on and off first where a threshold for the MOSFET is lower than that for the IGBT. This achieves a larger number of on-off patterns, so that the range of control can be extended.

A gate current flowing in a device is reduced to reduce turn-on speed if the device has a gate connected to a resistive element. Thus, the resistive element is connected to the gate of an IGBT if a MOSFET is to be turned on first.

A slope of a rising edge and that of a falling edge of a collector-to-emitter (drain-to-source) saturation voltage (dv/dt) at the time of turn-on and turn-off are generally gentler in an IGBT than in a MOSFET. Further, a feedback capacitance is determined by a total of the feedback capacitances of the MOSFET and the IGBT. This makes dv/dt more gentler to cause increase of turn-on loss. Thus, for reduction of loss to be generated at the time of turn-on, the MOSFET achieving switching speed higher than that of the IGBT is turned on first.

Figure 16:
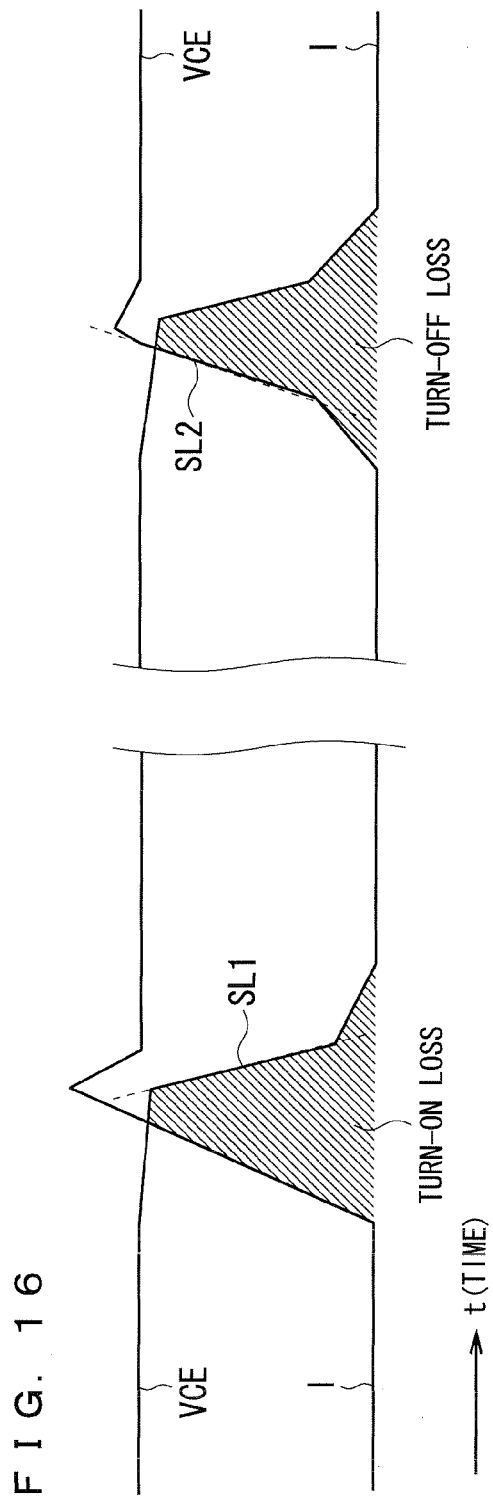

Reduction of loss to be generated at the time of turn-on is explained below by referring to FIGS. 16 to 19. FIG. 16 shows the current and voltage characteristics of an IGBT at the time of turn-on and the current and voltage characteristics of the IGBT at the time of turn-off, and specifically, shows the waveform of a collector-to-emitter voltage VCE and that of a current I of the IGBT.

In FIG. 16, turn-on loss is determined as a region defined by the falling edge waveform of the collector-to-emitter voltage VCE and the rising edge waveform of the current I at the time of turn-on, and a slope SL1 of the falling edge of the collector-to-emitter voltage VCE indicates dv/dt at the time of turn-on. Thus, loss to be generated at the time of turn-on is increased if dv/dt is gentle.

Turn-off loss is determined as a region defined by the rising edge waveform of the collector-to-emitter voltage VCE and the falling edge waveform of the current I at the time of turn-off, and a slope SL2 of the rising edge of the collector-to-emitter voltage VCE indicates dv/dt at the time of turn-off. Thus, loss to be generated at the time of turn-off is increased if dv/dt is gentle.

As shown in FIG. 4, feedback capacitances exist as parasitic capacitances between the collector and the gate of an IGBT and between the drain and the gate of a MOSFET. In the circuit during switching operation, electric charge in these feedback capacitances functions in a manner shown in FIGS. 17 and 18.

Figure 17:
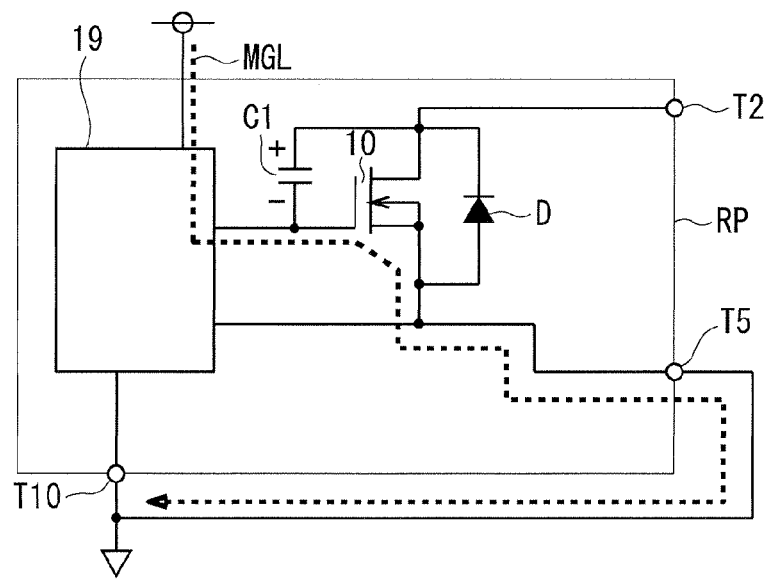
FIGS. 17 and 18 explain switching operation performed when a feedback capacitance is charged.
Figure 18:
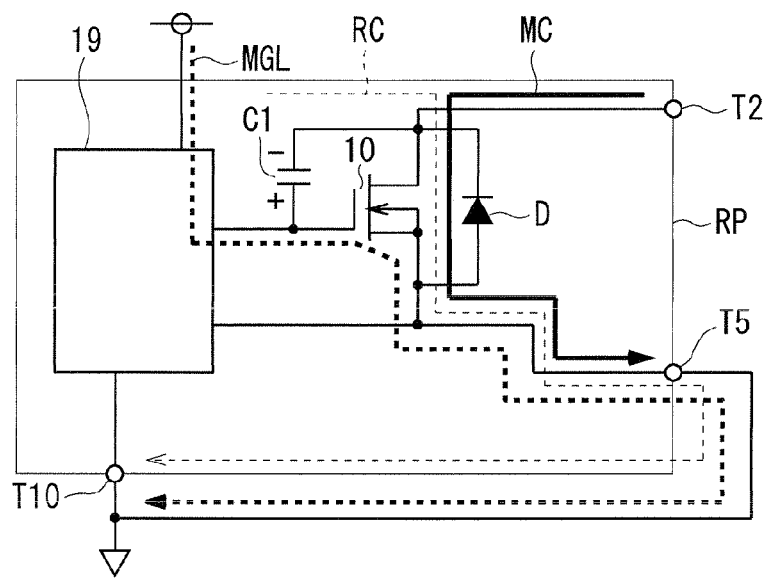

For the sake of convenience, FIGS. 17 and 18 show current flows determined when only the MOSFET 10 operates whereas the IGBT 4 and the MOSFET 10 in combination are driven in parallel. A feedback capacitance C1 exists between the drain and the gate of the MOSFET 10. A diode D is connected in antiparallel to the MOSFET 10, and the diode D is an internal parasitic diode, When application of a gate voltage is started for turn-on of the MOSFET 10, a gate current first starts to flow from the gate to the source as indicated by a gate-charge loop MGL in FIG. 17, and then flows into the ground via the terminal T5, thereby charging the input capacitance of the gate.

When the gate voltage reaches a threshold voltage thereafter, the MOSFET 10 is turned on. In response, a main circuit current MC starts to flow from the terminal T2 into the terminal T10 via the MOSFET 10 as shown in FIG. 18. This places the gate at a potential higher than that of the drain, so that charge of the feedback capacitance C1 is started. As a result, most of the gate current flows as a charging current RC into the feedback capacitance C1.

Figure 19:
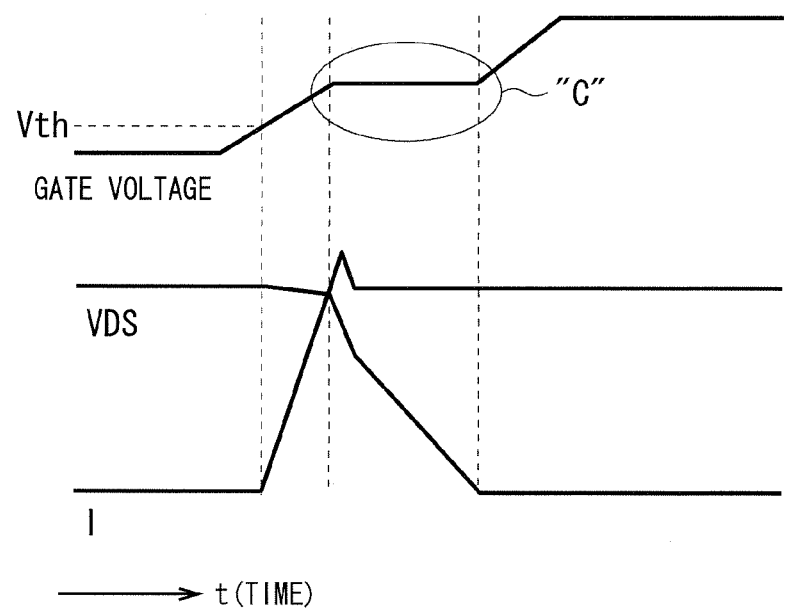

FIG. 19 shows the current and voltage characteristics and the gate voltage characteristics of the MOSFET 10 at the time of turn-on. After the gate voltage reaches a threshold voltage (Vth) and after a drain-to-source voltage VDS starts to drop, the gate voltage does not increase and goes into a flat period indicated by a region "C." This period lasts until the feedback capacitance C1 is charged, and the drain-to-source voltage VDS drops with a gentle slope in this period.

Thus, a larger feedback capacitance requires longer time for charging the feedback capacitance. This extends the flat period indicated by the region "C," so that loss to be generated at the time of turn-on is increased.

If a MOSFET and an IGBT are connected in parallel, a feedback capacitance is determined by a total of the feedback capacitances of the MOSFET and the IGBT. This further extends time required for charging the feedback capacitance, increasing loss to be generated at the time of turn-on.

In response, a MOSFET achieving switching speed higher than that of an IGBT is turned on first, so that turn-on of the IGBT is started after the MOSFET is turned on. Thus, the feedback capacitance is not determined by a total of those of the MOSFET and the IGBT to avoid extension of turn-on time, thereby achieving reduction of loss to be generated at the time of turn-on.

<Fourth Modification>

In the three-phase inverter module 100 described above, on-off timing is controlled by a resistive element embedded in a switching device and a balance between the respective thresholds for an IGBT and a MOSFET. Meanwhile, on-off timing may also be controlled by a diode element connected in series to the resistive element.

Figure 20:
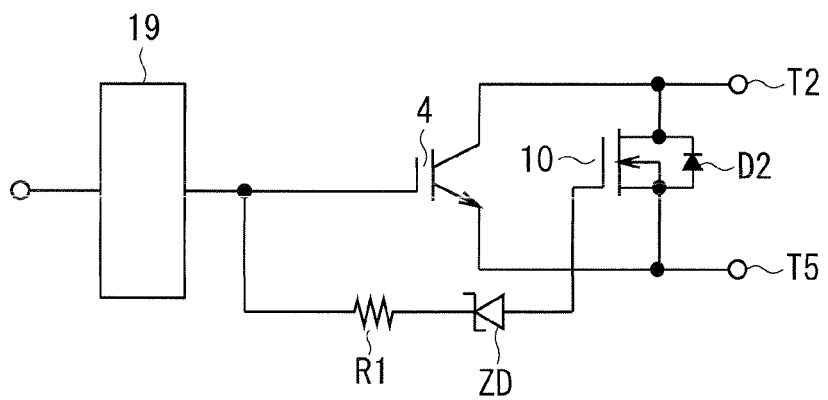
FIGS. 20 to 23 each show a structure according to a modification of the preferred embodiment of the present invention.

FIG. 20 shows a structure where the IGBT 4 is arranged near the gate control circuit 19, the MOSFET 10 is arranged far from the gate control circuit 19, the anode of a Zener diode ZD is connected to the gate of the MOSFET 10, and the resistive element R1 is connected to the cathode of the Zener diode ZD.

In this structure, timing of turn-on of the MOSFET 10 can be controlled by using the Zener diode ZD without the need of adjusting the characteristics of the MOSFET 10.

More specifically, according to the characteristics of a Zener diode, a current is not caused to flow until a certain voltage (breakdown voltage) is reached, and is caused to flow when the breakdown voltage is exceeded. Thus, connecting the Zener diode ZD to the gate of the MOSFET 10 as shown in FIG. 20 causes a gate current to flow after a gate voltage exceeds the breakdown voltage of the Zener diode ZD. As a result, the MOSFET 10 can be turned on with a voltage determined by a total of the breakdown voltage of the Zener diode and a threshold voltage for the MOSFET 10. This allows timing control of turn-on of the MOSFET 10 without the need of adjusting a threshold for the MOSFET 10.

A Zener diode is not always connected to a MOSFET, and is not limited to a device to which a resistive element is connected. Regarding a MOSFET, however, increasing a threshold for the MOSFET increases its ON-resistance to result in larger loss. Connecting a Zener diode to the MOSFET makes it unnecessary to increase a threshold for the MOSFET, so that loss increase is avoided.

Like a resistive element, the Zener diode ZD may be embedded in either an IGBT or a MOSFET.

<Fifth Modification>

In the three-phase inverter module 100 described above, a wire connecting the emitter of an IGBT and the source of a MOSFET and a wire connecting the respective gate pads of the IGBT and the MOSFET are made of different materials. More specifically, an aluminum wire is used as the wire connecting the emitter and the source, and a gold or copper wire is used as the wire connecting the gate pads.

Figure 21:
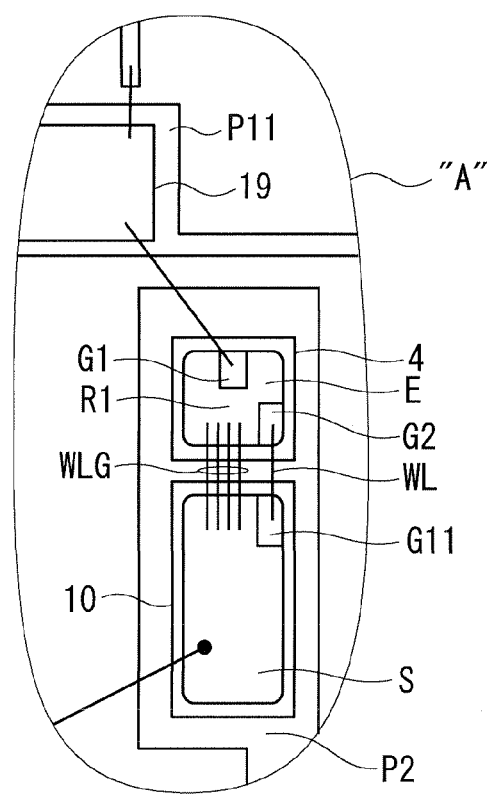

The wire connecting the emitter and the source may be made of the same material as the wire connecting the gate pads. FIG. 21 shows an example of such a structure.

FIG. 21 shows a structure where the MOSFET 10 is arranged far from the gate control circuit 19, and the emitter E of the IGBT 4 and the source S of the MOSFET 10 are connected via a wire made of the same material as a wire WL connecting the gate pad G2 of the IGBT 4 and the gate pad G11 of the MOSFET 10.

A current flowing between the emitter and the source is larger than a gate current, so that the emitter and the source are connected via a wire group WLG as shown in FIG. 21.

This structure does not require different wire bonding steps for connecting the emitter and the source and for connecting the gate pads, thereby allowing simplification of manufacturing steps.

<Sixth Modification>

In the three-phase inverter module 100 described above, as described by referring to FIG. 2, the gate control circuits 18 and 19 are mounted on the die pads P11 and P12 of the lead frame LF1 respectively, switching devices including the IGBTs 1 to 6 and the MOSFETs 7 to 12 are mounted on the die pads P1 to P4 of the lead frame LF2, and the lead frames LF1 and LF2 are arranged so as to face each other.

The die pads P1 to P4 on which the switching devices are mounted are greater in thickness than the die pads P11 and P12. Thus, during wire bonding for connecting the switching devices and the gate control circuits 18 and 19 via the lines 13 and the lines 14, a height difference is generated as a result of difference in thickness between the die pads, so that a wire loop can be formed easily.

Meanwhile, switching devices to be driven in parallel are mounted on a common die pad as shown in FIG. 3. Thus, a height difference is not generated so it is hard to form a wire loop. This may lead to shortage in the height of a wire loop or falling of a wire. Shortage in the loop height makes falling of a wire more likely, particularly if the wire is a gold wire through which a gate control signal is to be applied, for example.

Figure 22:
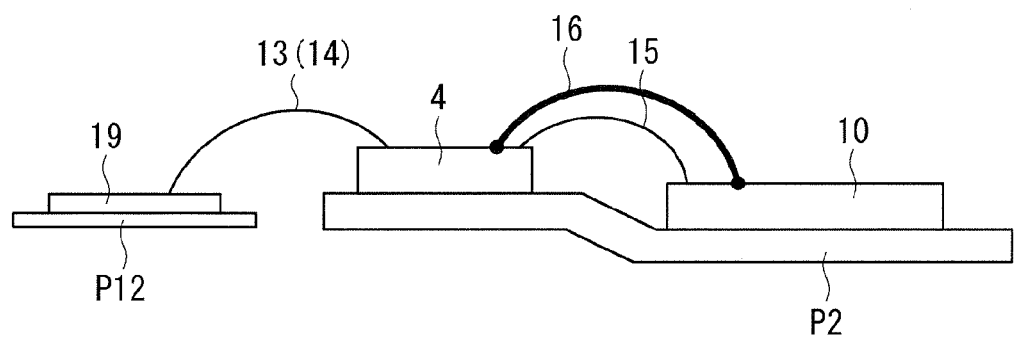

In response, a die pad on which switching devices are to be mounted is given a step as shown in FIG. 22. FIG. 22 shows a structure where the die pad P2 on which the IGBT 4 and the MOSFET 10 are mounted is bent such that a step is formed between regions where the IGBT 4 and the MOSFET 10 are mounted, thereby forming a height difference between the IGBT 4 and the MOSFET 10.

This structure avoids a problem resulting from shortage in the height of a wire loop during wire bonding.

The height difference between the IGBT 4 and the MOSFET 10 is substantially the same as the thickness of a switching device.

<Seventh Modification>

In the three-phase inverter module 100 described above, as described by referring to FIG. 3, the IGBT 4 has the two gate pads G1 and G2 in a plane of the emitter E and the gate pads G1 and G2 communicate with each other inside the IGBT 4, so that a gate control circuit applied from the gate control circuit 19 to the gate pad G1 can be taken out from the gate pad G2.

Alternatively, as described by referring to FIG. 6, the MOSFET 10 has the two gate pads G21 and G22 in a plane of the source S and the gate pads G21 and G22 communicate with each other inside the MOSFET 10, so that a gate control signal applied from the gate control circuit 19 to the gate pad G21 can be taken out from the gate pad G22.

The IGBT 4 and the MOSFET 10 of these structures including a plurality of gad pads are not arranged in a general layout, leading to increase of manufacturing cost.

Figure 23:
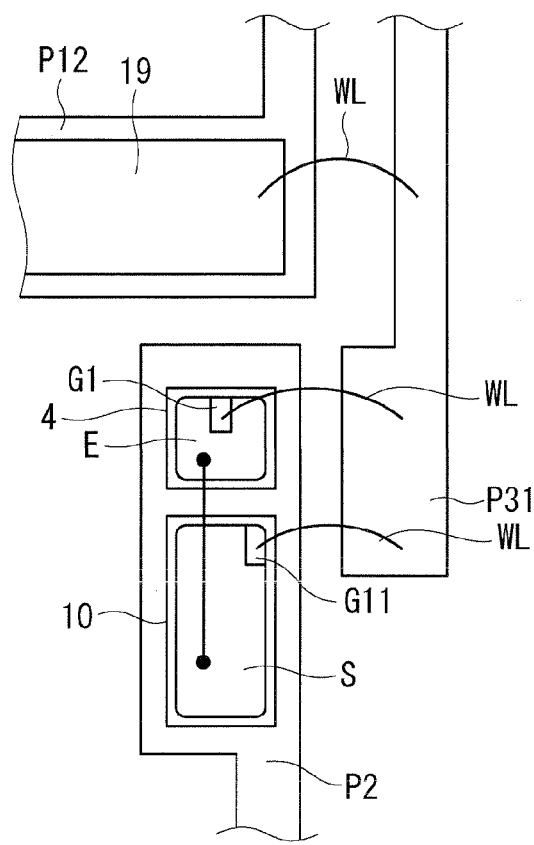

The increase of manufacturing cost is avoided by a structure shown FIG. 23. The structure of FIG. 23 includes a die pad P31 arranged to extend from a position near the die pad P12 on which the gate control circuit 19 is mounted to a position near the die pad P2 on which the IGBT 4 and the MOSFET 10 are mounted. The die pad P31 is part of the lead frame LF1 (FIG. 2), and a terminal of the die pad P31 is the lead LT1 (FIG. 2) which is used in a floating condition.

The die pad P31 and the gate control circuit 19 are connected by bonding via a wire WL, the gate pad G1 of the IGBT 4 and the die pad P31 are connected by bonding via the wire WL, and the gate pad G11 of the MOSFET 10 and the die pad P31 are connected by bonding via the wire WL.

In this structure, a gate control signal from the gate control circuit 19 is applied to the respective gates of the IGBT 4 and the MOSFET 10 via the die pad P31, so that a plurality of gate pads becomes unnecessary in the IGBT 4 (or MOSFET 10).

As a result, the IGBT 4 and the MOSFET 10 including one gate pad can be arranged in a general layout, so that increase of manufacturing cost is avoided.

<Eighth Modification>

In the three-phase inverter module 100 described above, a resistive element is embedded in a switching device such as the IGBT 4 and the MOSFET 10. Regarding a structure where a resistive element is connected to the gate of a switching device arranged far from the gate control circuit 18 or 19 as described by referring to FIGS. 10 and 12, a wire connecting switching devices may have a resistance value same as that of the aforementioned resistive element.

In this case, a wire to connect the switching devices is made of an alloy of nickel and chrome, and has a diameter of from 15 to 35 μm and a length of from 4 to 5 mm. Then, the switching devices are connected by bonding via the wire. As a result, this wire is allowed to have a resistance value (from 5 to 20Ω, for example) that is about 50 times that of a gold wire, and can substantially function as the aforementioned resistive element. This eliminates the need of providing a resistive element separately.

If the wire to connect the switching devices is made of an alloy of copper and nickel, has a diameter of from 15 to 35 μm and a length of from 4 to 5 mm, and the switching devices are connected by bonding via the wire, the wire is allowed to have a resistance value (from 2.5 to 10Ω, for example) that is about 25 times that of a gold wire. As a result, the wire can substantially function as the aforementioned resistive element, thereby eliminating the need of providing a resistive element separately.

<Ninth Modification>

In the description above, the types of a MOSFET and an IGBT are not specifically limited. The MOSFET or the IGBT may be a silicon (Si) semiconductor device formed on a silicon substrate, a silicon carbide (SiC) semiconductor device formed on a silicon carbide substrate, or a gallium nitride (GaN) series semiconductor device formed on a substrate made of a gallium nitride material.

SiC and GaN are wide band-gap semiconductors. A semiconductor device composed of a wide band-gap semiconductor achieves a high breakdown voltage and a high allowable current density, so that it can reduce the size of the three-phase inverter module 100 further than a silicon semiconductor device.

An IGBT can certainly be a wide band-gap semiconductor device, or both an IGBT and a MOSFET can be wide band-gap semiconductor devices.

More desirably, only the MOSFET is a wide band-gap semiconductor device, whereas the IGBT is a reverse conducting IGBT or RC-IGBT shortly formed on a silicon substrate.

As shown in FIGS. 5 and 8, for example, regarding the structure of a MOSFET, a parasitic diode not generally illustrated is connected in antiparallel between a drain and a source. During inverter operation with this structure, the parasitic diode is conducting to cause a free-wheeling current to flow in dead time when both a high-potential side switching device and a low-potential side switching device are off, and the parasitic diode functions as what is called a free-wheeling diode.

If the MOSFET is a MOSFET made of SiC as a wide band-gap semiconductor, a parasitic diode of the SiC-MOSFET generates voltage drop in the forward direction larger than that of a parasitic diode of an Si-MOSFET. Hence, power loss in the free-wheeling diode to be generated during flow of the aforementioned free-wheeling current becomes larger than that in the Si-MOSFET.

In response, an RC-IGBT made of Si is used as an IGBT connected in parallel to the MOSFET. As a result, the aforementioned free-wheeling current mainly flows in an antiparallel diode embedded in the RC-IGBT made of Si generating small voltage drop in the forward direction, so that power loss to be generated during flow of the aforementioned free-wheeling current is not increased.

An RC-IGBT is a device including an IGBT and a diode connected in antiparallel to the IGBT and integral with the IGBT, and has a well-known structure.

The preferred embodiment of the present invention can be modified or omitted where appropriate without departing from the scope of the present invention.

While the invention has been shown and described in detail, the foregoing description is in all aspects illustrative and not restrictive. It is therefore understood that numerous modifications and variations can be devised without departing from the scope of the invention.

What is claimed is:
1. A power semiconductor device, comprising:
an inverter composed of a first switching part and a second switching part interposed in series between a first power source line through which a first voltage is applied and a second power source line through which a second voltage is applied, the first and second switching parts operating complementarily; and
a first control circuit and a second control circuit that control switching operations of said first and second switching parts respectively, said first and second switching parts and said first and second control circuits being combined into a module, wherein said first switching part includes a first IGBT and a first MOSFET, said first IGBT and said first MOSFET each having one main electrode connected to said first power source line and an opposite main electrode connected to an output node of said inverter, said second switching part includes a second IGBT and a second MOSFET, said second IGBT and said second MOSFET each having one main electrode connected to said second power source line and an opposite main electrode connected to said output node of said inverter, in a planar layout showing a planar arrangement of respective components within said power semiconductor device, said first control circuit is arranged to face said first switching part, one of said first IGBT and said first MOSFET is arranged near said first control circuit, and the other of said first IGBT and said first MOSFET is arranged in a position farther from said first control circuit than a transistor near said first control circuit, said second control circuit is arranged to face said second switching part, one of said second IGBT and said second MOSFET is arranged near said second control circuit, and the other of said second IGBT and said second MOSFET is arranged in a position farther from said second control circuit than the transistor near said second control circuit, the transistor being one of said first IGBT and said first MOSFET and arranged near said first control circuit applies a gate control signal from said first control circuit to a gate of the transistor arranged far from said first control circuit, the transistor being one of said second IGBT and said second MOSFET and arranged near said second control circuit applies a gate control signal from said second control circuit to a gate of the transistor arranged far from said second control circuit, a gate control signal is applied from said first control circuit via a resistive element to a gate of a transistor being one of said first IGBT and said first MOSFET, and a gate control signal is applied from said second control circuit via a resistive element to a gate of a transistor being one of said second IGBT and said second MOSFET.

2. The power semiconductor device according to claim 1, wherein a gate control signal is applied from said first control circuit via said resistive element to the transistor being one of said first IGBT and said first MOSFET and arranged near said first control circuit, and a gate control signal is applied from said second control circuit via said resistive element to the transistor being one of said second IGBT and said second MOSFET and arranged near said second control circuit.

3. The power semiconductor device according to claim 2, wherein in said first switching part, said first IGBT is arranged near said first control circuit, and in said second switching part, said second IGBT is arranged near said second control circuit.

4. The power semiconductor device according to claim 2, wherein in said first switching part, said first MOSFET is arranged near said first control circuit, and in said second switching part, said second MOSFET is arranged near said second control circuit.

5. The power semiconductor device according to claim 1, wherein a gate control signal is applied from said first control circuit via said resistive element to the transistor being one of said first IGBT and said first MOSFET and arranged far from said first control circuit, and a gate control signal is applied from said second control circuit via said resistive element to the transistor being one of said second IGBT and said second MOSFET and arranged far from said second control circuit.

6. The power semiconductor device according to claim 5, wherein in said first switching part, said first IGBT is arranged near said first control circuit, and in said second switching part, said second IGBT is arranged near said second control circuit.

7. The power semiconductor device according to claim 5, wherein in said first switching part, said first MOSFET is arranged near said first control circuit, and in said second switching part, said second MOSFET is arranged near said second control circuit.

8. The power semiconductor device according to claim 2, wherein said transistor arranged near said first control circuit in said first switching part has said resistive element provided between a gate pad and a gate thereof, and said transistor arranged near said second control circuit in said second switching part has said resistive element provided between a gate pad and a gate thereof.

9. The power semiconductor device according to claim 1, wherein in said first switching part, a threshold for said first IGBT, a threshold for said first MOSFET, and a destination of connection of said resistive element are determined such that said first MOSFET is turned on before said first IGBT, and in said second switching part, a threshold for said second IGBT, a threshold for said second MOSFET, and a destination of connection of said resistive element are determined such that said second MOSFET is turned on before said second IGBT.

10. The power semiconductor device according to claim 1, wherein said first switching part further includes a Zener diode connected in series to said resistive element, and said second switching part further includes a Zener diode connected in series to said resistive element.

11. The power semiconductor device according to claim 1, wherein each of said first IGBT and said first MOSFET is a vertical transistor where a main current flows in a direction vertical to the main surface of a semiconductor substrate, in said first switching part, the transistor arranged near said first control circuit has a first gate pad and a second gate pad connected to the gate thereof, the first gate pad being arranged in a plane of said opposite main electrode to be on the same side as said first control circuit, said second gate pad being arranged in a plane of said opposite main electrode to be on a side opposite said first control circuit, said gate control signal from said first control circuit is applied to said first gate pad, is output from said second gate pad, and is applied to a gate pad of the transistor arranged far from said first control circuit, each of said second IGBT and said second MOSFET is a vertical transistor where a main current flows in a direction vertical to the main surface of a semiconductor substrate, in said second switching part, the transistor arranged near said second control circuit has a first gate pad and a second gate pad connected to the gate thereof, the first gate pad being arranged in a plane of said opposite main electrode to be on the same side as said second control circuit, said second gate pad being arranged in a plane of said opposite main electrode to be on a side opposite said second control circuit, and said gate control signal from said second control circuit is applied to said first gate pad, is output from said second gate pad, and is applied to a gate pad of the transistor arranged far from said second control circuit.

12. The power semiconductor device according to claim 11, wherein in said first switching part, a first wire electrically connects said second gate pad of said transistor arranged near said first control circuit and said gate pad of said transistor arranged far from said first control circuit, a plurality of said first wires electrically connects said opposite main electrode of said first IGBT and said opposite main electrode of said first MOSFET, in said second switching part, a second wire electrically connects said second gate pad of said transistor arranged near said second control circuit and said gate pad of said transistor arranged far from said second control circuit, and a plurality of said second wires electrically connects said opposite main electrode of said second IGBT and said opposite main electrode of said second MOSFET.

13. The power semiconductor device according to claim 11, wherein said first IGBT and said first MOSFET are arranged on a die pad having a step between a region where said first IGBT is mounted and a region where said first MOSFET is mounted, and said second IGBT and said second MOSFET are arranged on a die pad having a step between a region where said second IGBT is mounted and a region where said second MOSFET is mounted.

14. The power semiconductor device according to claim 11, wherein in said first switching part, a first wire electrically connects said second gate pad of said transistor arranged near said first control circuit and said gate pad of said transistor arranged far from said first control circuit, in said second switching part, a second wire electrically connects said second gate pad of said transistor arranged near said second control circuit and said gate pad of said transistor arranged far from said second control circuit, said first wire is made of an alloy of nickel and chrome and has a diameter of from 15 to 35 µm, whereby said first wire functions as said resistive element in said first switching part, and said second wire is made of an alloy of nickel and chrome and has a diameter of from 15 to 35 µm, whereby said second wire functions as said resistive element in said second switching part.

15. The power semiconductor device according to claim 11, wherein in said first switching part, a first wire electrically connects said second gate pad of said transistor arranged near said first control circuit and said gate pad of said transistor arranged far from said first control circuit, in said first switching part, a second wire electrically connects said second gate pad of said transistor arranged near said second control circuit and said gate pad of said transistor arranged far from said second control circuit, said first wire is made of an alloy of copper and nickel and has a diameter of from 15 to 35 µm, whereby said first wire functions as said resistive element in said first switching part, and said second wire is made of an alloy of copper and nickel and has a diameter of from 15 to 35 µm, whereby said second wire functions as said resistive element in said second switching part.

16. The power semiconductor device according to claim 1, wherein at least one of said first IGBT and said first MOSFET, and at least one of said second IGBT and said second MOSFET, are each a wide band-gap semiconductor device formed on a substrate made of a wide band-gap semiconductor material.

17. A power semiconductor device, comprising:

an inverter composed of a first switching part and a second switching part interposed in series between a first power source line through which a first voltage is applied and a second power source line through which a second voltage is applied, said first and second switching parts operating complementarily; and a first control circuit and a second control circuit that control switching operations of said first and second switching parts respectively, said first and second switching parts and said first and second control circuits being combined into a module, wherein said first switching part includes a first IGBT and a first MOSFET, said first IGBT and said first MOSFET each having one main electrode connected to said first power source line and an opposite main electrode connected to an output node of said inverter, said second switching part includes a second IGBT and a second MOSFET, said second IGBT and said second MOSFET each having one main electrode connected to said second power source line and an opposite main electrode connected to said output node of said inverter, in a planar layout of said power semiconductor device, said first control circuit is arranged to face said first switching part, one of said first IGBT and said first MOSFET is arranged near said first control circuit, and the other of said first IGBT and said first MOSFET is arranged in a position farther from said first control circuit than a transistor near said first control circuit, said second control circuit is arranged to face said second switching part, one of said second IGBT and said second MOSFET is arranged near said second control circuit, and the other of said second IGBT and said second MOSFET is arranged in a position farther from said second control circuit than the transistor near said second control circuit, a gate control signal is applied from said first control circuit via a resistive element to a gate of a transistor being one of said first IGBT and said first MOSFET, a gate control signal is applied from said second control circuit via a resistive element to a gate of a transistor being one of said second IGBT and said second MOSFET, said gate control signal from said first control circuit is applied to the respective gates of said first IGBT and said first MOSFET via a die pad extending from a position near said first control circuit to a position near said first IGBT and said first MOSFET, and said gate control signal from said second control circuit is applied to the respective gates of said second IGBT and said second MOSFET via a die pad extending from a position near said second control circuit to a position near said second IGBT and said second MOSFET.

18. The power semiconductor device according to claim 17, wherein at least one of said first IGBT and said first MOSFET, and at least one of said second IGBT and said second MOSFET, are each a wide band-gap semiconductor device formed on a substrate made of a wide band-gap semiconductor material.

19. The power semiconductor device according to claim 18, wherein
said first MOSFET is said wide band-gap semiconductor device,
said first IGBT is a reverse conducting IGBT,
said second MOSFET is said wide band-gap semiconductor device, and
said second IGBT is a reverse conducting IGBT.

* * * * *